United States Patent
Park

(10) Patent No.: US 7,118,976 B2
(45) Date of Patent: Oct. 10, 2006

(54) METHODS OF MANUFACTURING MOSFETS IN SEMICONDUCTOR DEVICES

(75) Inventor: Cheolsoo Park, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 110 days.

(21) Appl. No.: 10/745,855

(22) Filed: Dec. 26, 2003

(65) Prior Publication Data

US 2004/0137675 A1    Jul. 15, 2004

(30) Foreign Application Priority Data

Dec. 30, 2002    (KR)    ..................... 10-2002-0086240

(51) Int. Cl.
*H01L 21/336*    (2006.01)

(52) U.S. Cl. ..................... 438/300; 438/230; 438/303; 438/413; 438/558

(58) Field of Classification Search ................ 438/294, 438/413, 514, 533, 299–303, 230, 305–307, 438/542, 548, 558–560
See application file for complete search history.

(56) References Cited

U.S. PATENT DOCUMENTS 5,633,201 A    5/1997    Choi .......................... 438/620
6,462,366 B1 *    10/2002    Hsu et al. .................... 257/295
6,521,508 B1    2/2003    Cheong et al. ............. 438/416
6,717,202 B1 *    4/2004    Sugawara et al. .......... 257/309
2001/0019872 A1 *    9/2001    Havemann ................... 438/305
2002/0192868 A1 *    12/2002    Kim ........................... 438/112

* cited by examiner

*Primary Examiner*—Thanhha Pham
(74) *Attorney, Agent, or Firm*—Andrew D. Fortney

(57) ABSTRACT

Methods of fabricating MOSFETs in semiconductor/r devices are disclosed. One example method may include forming an isolation layer on a semiconductor substrate and forming a capping layer thereon, forming an epitaxial active region which is not covered with the isolation layer on said semiconductor substrate by using selectively epitaxial growth, and forming a gate dielectric layer and a gate electrode on said epitaxial active region, sequentially. The example method may also include forming a source/drain plug spaced apart from the both sides of said gate electrode in said epitaxial active region, forming a source/drain into said epitaxial active region on which said source/drain plug is formed, forming an interlayer dielectric layer on the entire surface of the resultant structure after the source/drain is formed; and forming contacts in said interlayer dielectric layer, wherein said contacts are connected to said gate electrode and said source/drain plug, respectively.

9 Claims, 3 Drawing Sheets

METHODS OF MANUFACTURING MOSFETS IN SEMICONDUCTOR DEVICES

TECHNICAL FIELD

The present disclosure relates to semiconductors and, more particularly, to methods of manufacturing metal oxide semiconductor field effect transistors (MOSFETS) in semiconductor devices.

BACKGROUND

In general, a MOSFET has a structure including a gate electrode, a source/drain electrode, and an oxide layer therebetween, which are formed on a silicon substrate.

Recently, as semiconductor devices have become highly integrated, miniaturized, and lightweight, physical size of the MOSFET is scaled down, thereby decreasing a valid channel length and causing a short channel effect deteriorating a punch-through between a source and a drain.

To resolve such problems, a source/drain formed in a lightly doped drain (hereinafter referred to as "LDD") structure have been proposed. The source/drain has a shallow junction to decrease the short channel effect. However, in a highly integrated semiconductor device having a MOSFET with a smaller line width, it is difficult to fabricate the LDD structure.

Meanwhile, U.S. Pat. No. 6,521,508 discloses a method for manufacturing a contact plug in a semiconductor device using a selective epitaxial silicon growth process, and U.S. Pat. No. 5,633,201 discloses a method for forming tungsten (or aluminum) plugs in contact holes of highly integrated semiconductor device. However, as a semiconductor device becomes highly integrated and miniaturized, contacts connected with the gate electrode, a bit line and contact holes therefore are getting smaller. Accordingly, a contact hole manufacturing process for forming the contacts or contact plugs by depositing a conductive material into the contact holes comes to have limitations when the contact holes are formed in the highly integrated semiconductor device.

DETAILED DESCRIPTION

Figure 1A:
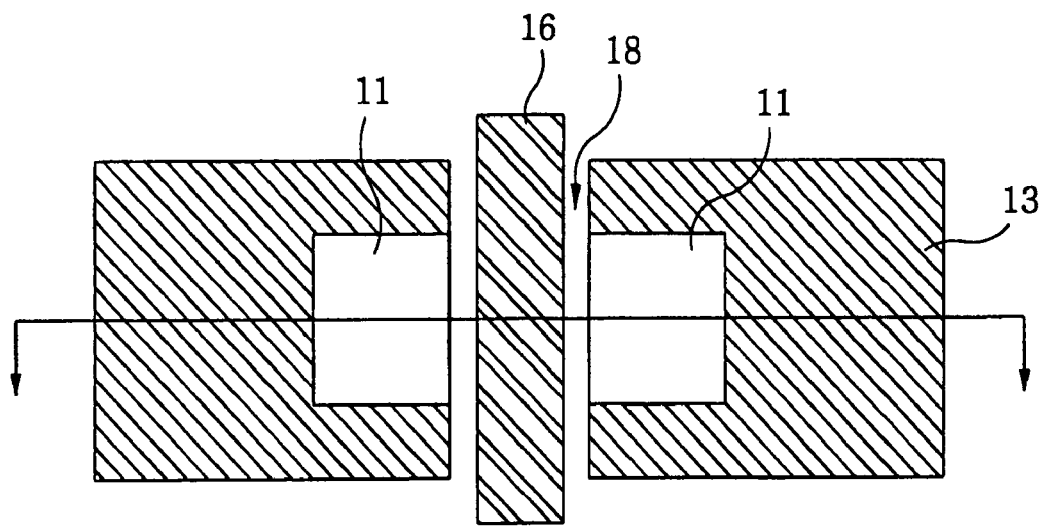
FIGS. 1A and 1B respectively illustrate a top view and a cross sectional view showing forming a gate electrode in a MOSFET.
Figure 1B:
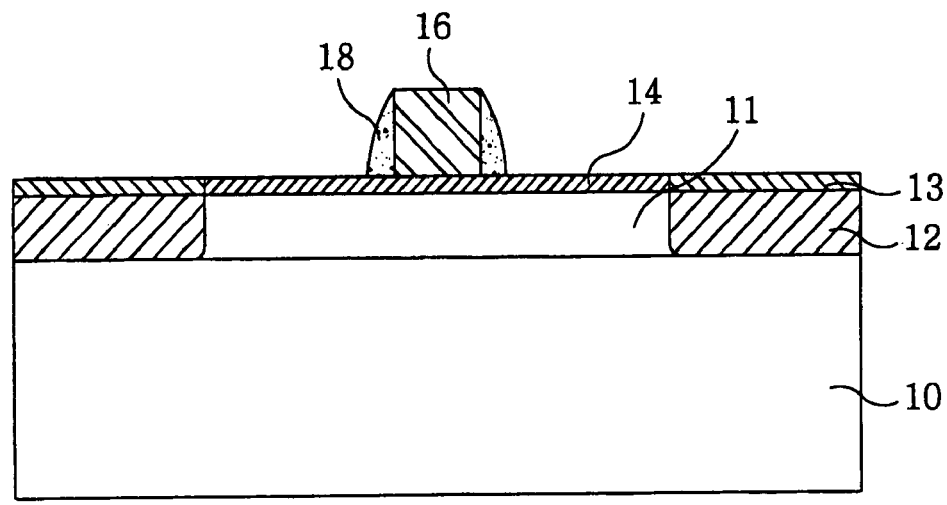

Referring to FIGS. 1A and 1B, an isolation layer 12 for isolating an active region from an inactive region is formed on a silicon substrate 10 and a silicon nitride (SiN) layer as a capping layer 13 is thinly formed on the isolation layer 12. According to one example, the isolation layer 12 is formed by a thermal oxidation process. An epitaxial active region 11 is formed by growing the silicon substrate, which is not covered with the isolation layer 12, up to a level of a top surface of the isolation layer 12 using a selective epitaxial silicon growth process. Because the capping layer 13 is formed on the isolation layer 12, only the exposed silicon substrate grows epitaxially.

Subsequently, a silicon oxide layer as a gate dielectric layer 14 is formed on the epitaxial active region 11. A doped polysilicon layer is deposited on the gate dielectric layer 14 and a gate electrode 16 is formed by patterning the doped polysilicon layer. A spacer dielectric layer 18 is formed on sidewalls of the gate electrode 16.

Figure 2:
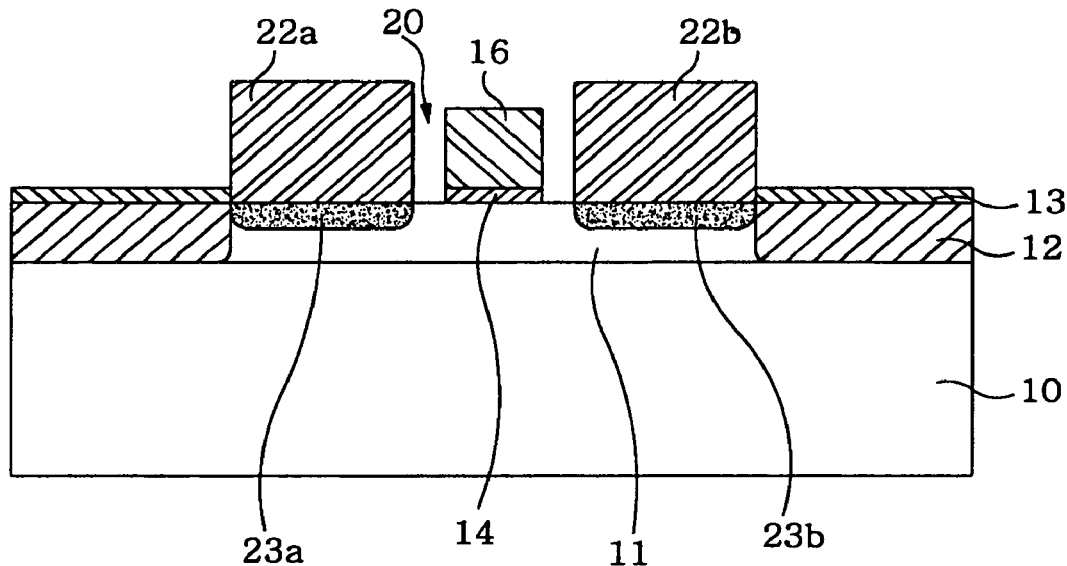
FIG. 2 depicts a cross sectional view showing forming a source/drain in a MOSFET.

As shown in FIG. 2, the epitaxial active region 11 is exposed by etching the gate dielectric layer 14 using the gate electrode 16 and the spacer dielectric layer 18 as a mask. Then, the exposed epitaxial active region on the both sides of the gate electrode 16 grows by the selective epitaxial silicon growth process, to form a source/drain plug 22a, 22b spaced apart from both sides of the gate electrode 16.

According to one example, the source/drain plug 22a, 22b is formed of a n+/p+ doped silicon layer, a source/drain 23a, 23b is formed by diffusing a n+/p+ dopant into the epitaxial active region 11 using an annealing process.

Alternatively, according to another example, the source/drain plug 22a, 22b is formed of an undoped silicon layer, the source/drain 23a, 23b is formed by diffusing the n+/p+ dopant into the epitaxial active region 11 by practicing a doped ion implantation process and an annealing process, sequentially.

The spacer dielectric layer 18 and the gate dielectric layer 14 thereunder are then removed.

As a result, the gate electrode 16 and the source/drain plug 22a, 22b are separated by a gap 20 equal to the thickness of the spacer dielectric layer 18, and the gap 20 will be a length of an LDD region, as described hereinafter.

Figure 3:
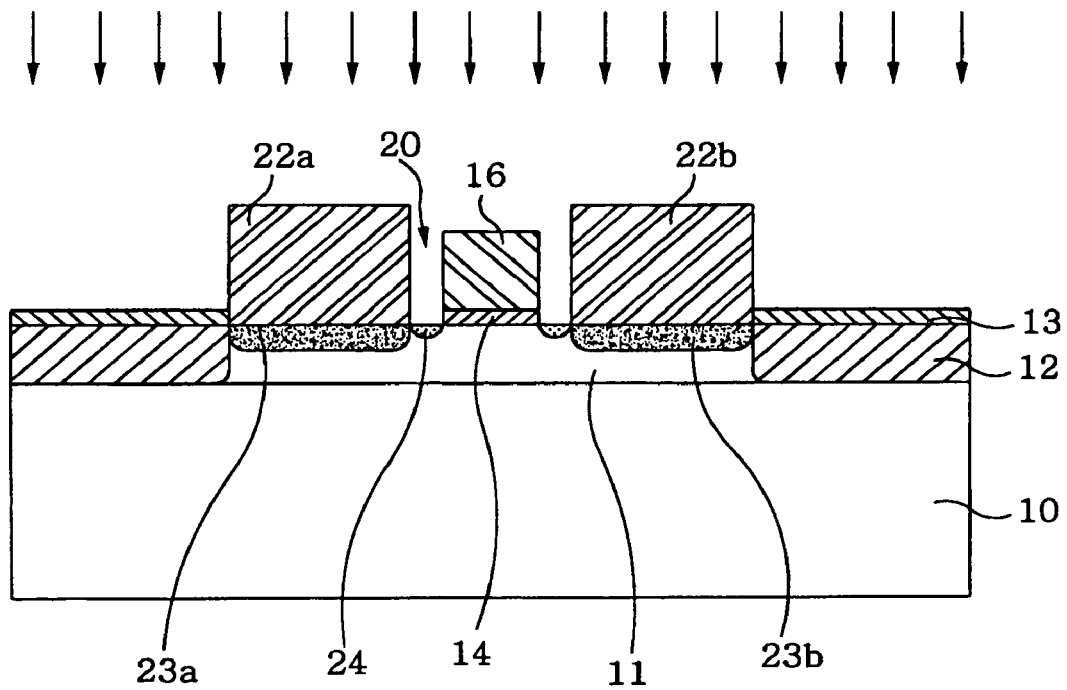
FIG. 3 describes a cross sectional view showing forming a LDD region in a MOSFET.

Referring to FIG. 3, by performing an n−/p− ion implantation process, the LDD region 24 is formed into the epitaxial active region 11 between the gate electrode 16 and the source/drain plug 22a, 22b.

Figure 4:
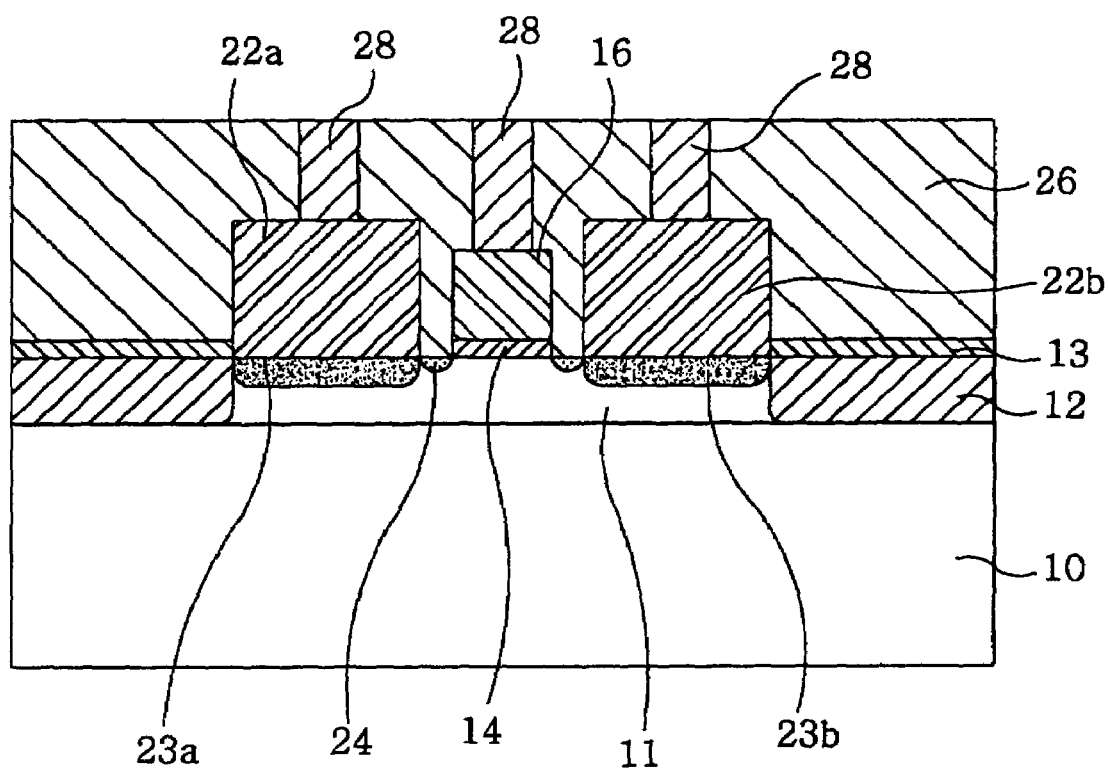
FIG. 4 illustrates a cross sectional view showing forming contacts in a MOSFET.

As shown in FIG. 4, an interlayer dielectric layer 26 is formed on the entire surface of the resultant structure. Contact holes, through which the gate electrode 16 and the source/drain plug 22a, 22b in the interlayer dielectric layer 26 are exposed, are formed by performing a contact manufacturing process. Subsequently, a conductive material, e.g., a doped polysilicon, is filled into the contact holes, and the conductive material on the dielectric layer 26 is removed and planarized by a chemical mechanical polishing ("CMP") process or a whole surface etching process, thereby forming contacts 28 connected to the gate electrode 16 and the source/drain plug 22a, 22b, respectively.

Conversely, the LDD region may be formed by using the interlayer dielectric layer 26 made of a borosilicate glass ("BSG") or a phosphosilicate glass ("PSG") instead of the ion implantation process described above. Specifically, after the spacer dielectric layer 18 and the gate dielectric layer thereunder are removed, the interlayer dielectric layer 26 made of the BSG or the PSG is formed on the entire surface of the resultant structure. The LDD region 24 is then formed by diffusing B (p dopant) or P (n dopant) of the interlayer dielectric layer 26 into the epitaxial active region 11 between the gate electrode 16 and the source/drain plug 22a, 22b using the annealing process.

In accordance with the process of the present invention, the active region and the source/drain plug are formed by performing a selective epitaxial silicon growth process. As a result, a short channel effect of the highly integrated semiconductor devices can be prevented and a contact hole manufacturing process for forming the source/drain plug can be eliminated.

Although certain methods are described herein, the scope of coverage of this patent is not limited thereto. On the contrary, this patent covers every apparatus, method and article of manufacture fairly falling within the scope of the appended claims either literally or under the doctrine of equivalents.

What is claimed is:

1. A method for fabricating a MOSFET in a semiconductor device, comprising:

forming an isolation layer on a semiconductor substrate and forming a capping layer thereon;

forming an epitaxial active region which is not covered with the isolation layer on said semiconductor substrate by using selective epitaxial growth;

forming a gate dielectric layer and a gate electrode on said epitaxial active region, sequentially;

forming a spacer dielectric layer on sidewalls of said gate electrode and patterning said gate dielectric layer by using said gate electrode and said spacer dielectric layer as a mask, after the gate electrode is formed;

forming a source/drain plug spaced apart from the both sides of said gate electrode on said epitaxial active region by another selective epitaxial growth;

forming a source/drain by a donant diffusion from said source/drain plug into said epitaxial active region on which said source/drain plug is formed;

removing said spacer dielectric layer and a portion of said gate dielectric layer, after said source/drain is formed;

forming an interlayer dielectric layer on the entire surface of the resultant structure after the source/drain is formed; and forming contacts in said interlayer dielectric layer, wherein said contacts are connected to said gate electrode and said source/drain plug, respectively.

2. A method as defined by claim 1, wherein said source/drain plug comprises a doped silicon layer.

3. A method as defined by claim 2, wherein forming said source/drain comprises performing an annealing process.

4. A method as defined by claim 1, wherein said source/drain plug comprises a silicon layer doped with an n+30/p+30 +0 dopant.

5. A method as defined by claim 4, wherein forming said source/drain comprises performing an ion implantation process to said source/drain plug and an annealing process, sequentially.

6. A method as defined by claim 1, before said interlayer dielectric layer is formed, further comprising:

forming a lightly doped drain ("LDD") region into said epitaxial active region between said gate electrode and said source/drain plug.

7. A method as defined by claim 6, wherein said lightly doped drain ("LDD") region comprises performing an ion implantation process.

8. A method as defined by claim 1, wherein said interlayer dielectric layer comprises a borosilicate glass ("BSG") or a phosphosilicate glass ("PSG").

9. A method as defined by claim 8, further comprising:

forming a lightly doped drain ("LDD") region into said epitaxial active region between said gate electrode and said source/drain plug by performing an annealing process, after forming said interlayer dielectric layer.

* * * * *